(12) United States Patent
Le Naour et al.

(10) Patent No.: US 7,536,160 B2
(45) Date of Patent: May 19, 2009

(54) WIDEBAND PHASE SHIFT DEVICE

(75) Inventors: Jean-Yves Le Naour, Badiers (FR);
Jean-Luc Robert, Betton (FR); Ali Louzir, Rennes (FR)

(73) Assignee: Thomson Licensing, Boulogne Billancourt (FR)

( * ) Notice: Subject to any disclaimer, the term of this patent is extended or adjusted under 35 U.S.C. 154(b) by 460 days.

(21) Appl. No.: 11/408,438

(22) Filed: Apr. 21, 2006

(65) Prior Publication Data
US 2006/0239384 A1     Oct. 26, 2006

(30) Foreign Application Priority Data
Apr. 25, 2005   (FR)   ................................... 05 51052

(51) Int. Cl.
*H04B 7/00*   (2006.01)
(52) U.S. Cl. ................. 455/276.1; 455/304; 455/189.1; 455/147; 375/327
(58) Field of Classification Search .............. 455/276.1, 455/304, 189.1, 147; 375/327
See application file for complete search history.

(56) References Cited

U.S. PATENT DOCUMENTS 3,581,201 A * 5/1971 Kravchenko et al. ..... 324/76.83
4,236,159 A * 11/1980 Alpers ........................ 342/378

FOREIGN PATENT DOCUMENTS

| DE | 197 31 480 A1 | 5/1998 |
| EP | 0 407 263 A1 | 1/1991 |
| WO | WO 97/08857 | 3/1997 |

OTHER PUBLICATIONS

Search Report, Sep 29, 2005.

* cited by examiner

*Primary Examiner*—Sanh D Phu
(74) *Attorney, Agent, or Firm*—Robert D. Shedd; Joseph J. Opalach

(57) ABSTRACT

The invention relates to a wideband phase shift device. A phase shift $\phi$ is introduced on the fixed frequency local oscillator. The principle of the invention is to realise a double translation of the input signals. The phase variation introduced at the level of the local oscillator has a positive value on one of the translated signals and a negative value on the other. The signals are recombined at the reception frequency with a phase difference of $2\phi$ so as to maximise the amplitude of the signal at the output of the summator.

5 Claims, 3 Drawing Sheets

US 7,536,160 B2

WIDEBAND PHASE SHIFT DEVICE

This application claims the benefit, under 35 U.S.C. §119 of French Patent Application 05/51052, filed Apr. 25, 2005.

BACKGROUND OF THE INVENTION

1. Field of the Invention

The present invention relates to a wideband phase shift device more particularly a phase shift device for a receiver used in the framework of digital terrestrial television, such as an OFDM (pour Orthogonal Frequency Division Multiplexing) receiver.

2. Description of the Prior Art

In a standard signal reception system for DVB-T (Digital Video Broadcasting-Terrestrial) digital terrestrial television, a modulation of the OFDM type is most frequently used. This is a particularly robust modulation and makes the isofrequency retransmission of a DVB-T channel possible in a domestic environment. The DVB-T signals can thus be captured at a point in the environment where they are at a sufficient level, then amplified and retransmitted in the environment to be captured identically from this retransmitter by "portable" digital receivers such as digital television sets or analogue television sets equipped with digital terrestrial decoders. This is the principle retained for Digital Terrestrial Television (DTT).

Nevertheless, in spite of the robustness of the modulation, notable reception problems occur for portable reception.

Currently, the solution favoured for obtaining a more robust reception consists in the use of more than one antenna (typically 2).

The two antennas are therefore physically positioned so as to receive two decorrelated received signals corresponding to the same transmitted signal. The distance for allowing the signals at the two antenna accesses to be decorrelated being approximately equal to 0.7 times the wavelength of the received signal, a difference between antennas in the order of 45 cm is obtained for the UHF band (470-860 MHz). It thus appears unrealistic to consider this type of relatively cumbersome concept owing to the dimension of the radiating elements.

Another technique consists in implementing a smart antenna device constituted by at least two separate RF (Radio frequency) accesses with a wideband phase shifter that can be controlled on one of the channels and a combination of the received signals, as shown in FIG. 1a.

However, the implementation of these two techniques is not easy, in the frequency band considered, owing to the congestion of the function at the relatively low frequencies considered here [470-860 MHz] as they do not enable an octave to be covered. Moreover, they cannot be integrated into a single component.

Another integrable approach consists of generating two quadrature signals (sine and cosine) from a single signal. Such an integrable circuit is shown in FIG. 1b. Each of these signals thus drives a variable gain amplifier LNA1 and LNA2, voltage controlled by a bias circuit CP. The particularity of this bias circuit is that the resultant at the output is amplitude constant, the phase of the resulting signal at the output varying according to the control voltage. However this integrable technique in a component does not enable an octave to be covered either.

The invention aims to overcome these disadvantages.

SUMMARY OF THE INVENTION

It proposes a new concept based on the use of two separate antennas and the introduction of a fixed frequency variable phase shift controlled on each of the channels by an electrical control introducing a gradual phase shift in the signals before summation. It also enables the destructive effect of combining the received signals to be prevented and the signal power to be maximised.

The object of the invention is a wideband phase shift device, more particularly for a digital signal receiver. It comprises translation means formed by a plurality of mixers to translate the first input signals received by the two antennas into two signals. It also comprises oscillation means for sending a local oscillation signal on each of the mixers.

The oscillation means comprises a local fixed frequency oscillator connected by means of a phase shifter to a first series of mixers and connected directly to a second series of mixers so as to compensate for the phase shift between the different input signals during a double frequency translation.

The invention has the advantage of introducing a phase shift on each of the channels. This phase shift is controlled well over a very wide frequency band as it is from a phase shift introduced on the fixed frequency local oscillator.

The invention also has the advantage that the phase shifter is simple to realise owing to the fact that firstly it operates at a fixed frequency and secondly that the phase variation required is at least halved.

In one embodiment, the phase shifter introduces a positive phase shift on one of the input signals and a negative phase shift on the other input signal so as to double the phase shift introduced by the phase shifter between intermediate frequency signals.

In another embodiment, the mixers are subharmonic mixers that can quadruple the phase shift introduced by the phase shifter between the intermediate frequency signals.

Preferentially, the wideband phase shift device can be integrated into a component.

BRIEF DESCRIPTION OF THE DRAWINGS

The invention will be better understood, and other specific features and advantages will emerge from reading the following description, the description making reference to the annexed drawings wherein.

DESCRIPTION OF THE PREFERRED EMBODIMENTS

Figure 1:
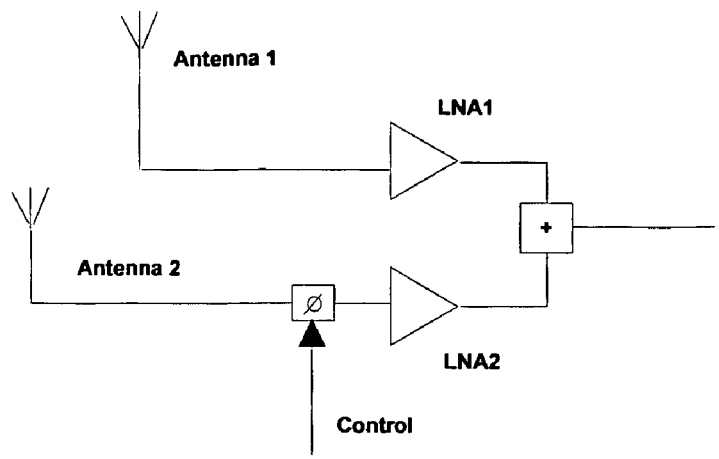
FIGS. 1a and 1b show phase shift block according to the prior art.
Figure 1B:
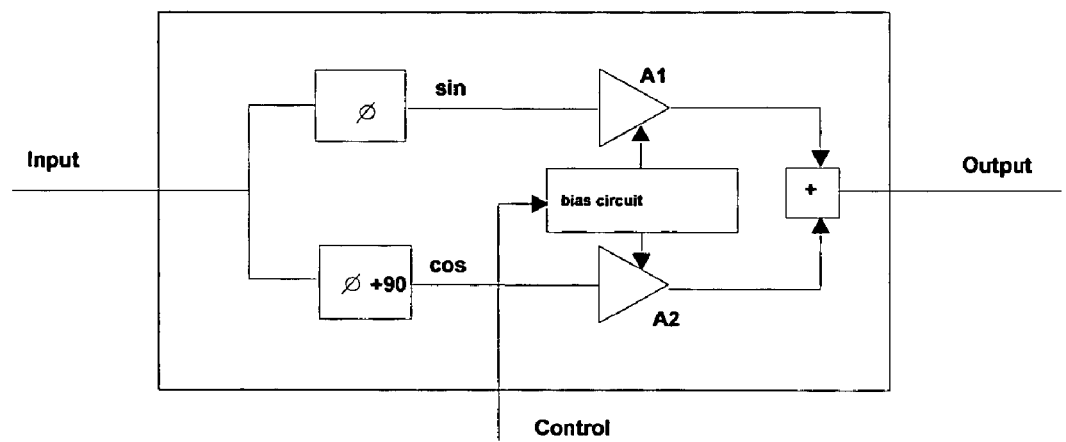
Figure 2:
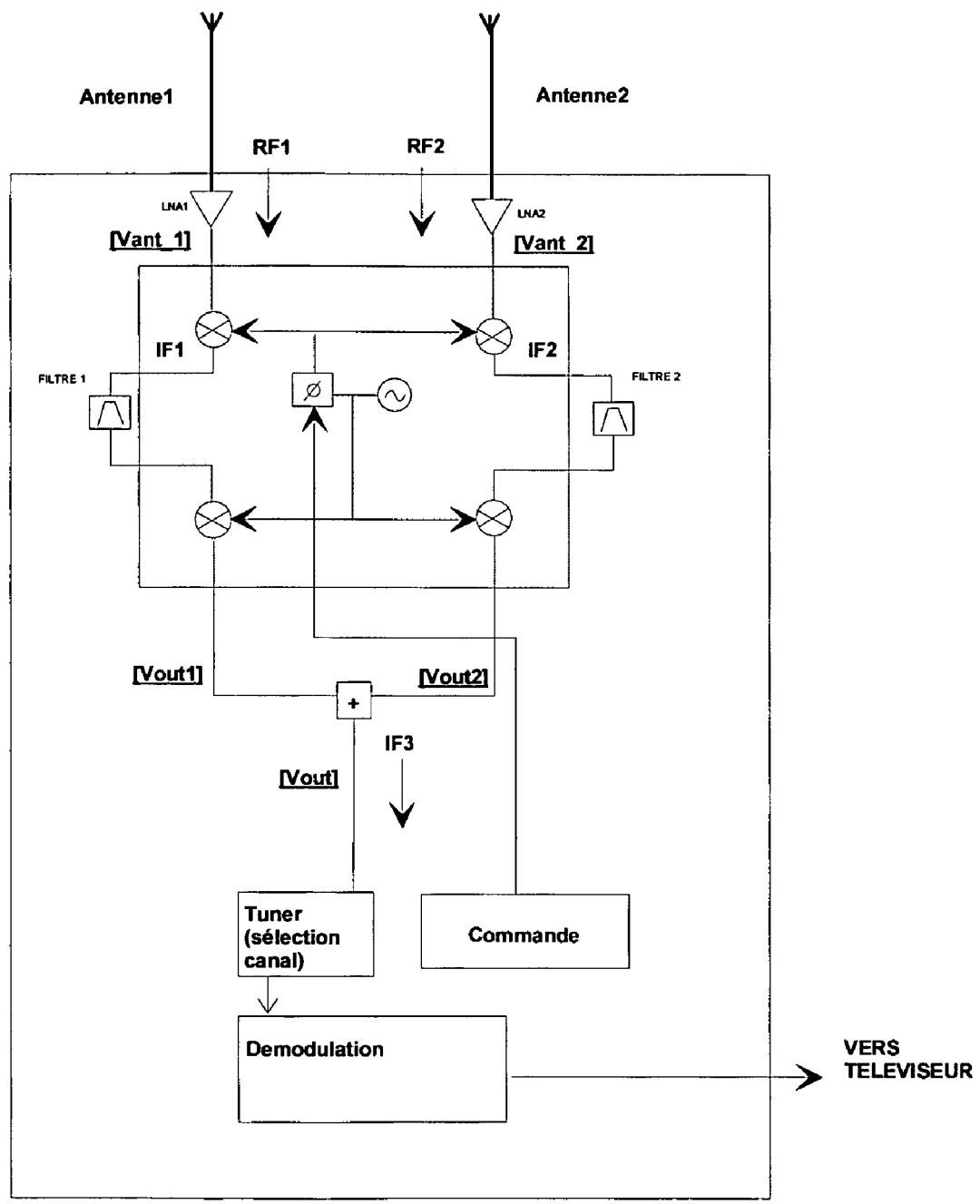
FIG. 2 is a synoptic of a wideband phase shift device in accordance with the present invention.

FIG. 2 corresponds to an embodiment of a wideband phase shift device in accordance with the present invention.

The wideband phase shift device 10 is part of a system for receiving signals received by antennas A1 and A2. A description is given for a number of antennas equal to 2. However, a greater number of antennas can be considered. This reception system comprises the LNA (Low Noise Amplifier) amplifiers 1, 2 connected respectively to the antennas A1 and A2, a phase shift device 10 to which are connected pass band filters 3, 4, a summator 5 connected to the outputs of the phase shift device, a tuner 6 for the selection of the reception channel, a demodulator 7 for demodulating the signal of the selected channel. It also comprises a phase shift control block 8 allowing the phase shift of the phase shift device 10 to be controlled.

The phase shift device 10 basically comprises oscillation means which are constituted by a fixed frequency local oscillator 16 delivering a signal OL for example at 1.98 GHz and a phase shifter 15 voltage controlled by the signal from the phase shift control block 8. It also comprises a first series of mixers 11 and 12 connected by filters to a second series of mixers 13 and 14, to realise a double frequency translation. It should be noted that the filters are not part of device. The device comprises connections to make connecting these filters easier.

Hence, on the first channel the input signal Vant1, received by the antenna A1 and amplified by the amplifier 1, is applied to the wideband phase shift device 10 as claimed. This signal Vant1 applied to one of the inputs of the mixer 11 is multiplied with the fixed frequency local oscillation signal from the local oscillator 16 and phase shifted by the phase shifter 15. This phase shifter 15 is voltage controlled by the signal from the control block 8, thus translating to the intermediate frequency. The sum and the difference of the frequencies are thus generated. By means of the filtering realised by the filter 3, the high band 2270-2660 MHz is selected thus allowing a supradyne mode translation. The translated signal IF1 is phase shifted by +φ with respect to the input signal. It will be shown further on that this phase shift +φ introduced by the phase shifter onto the translated signal enables half of the phase shift 2 φ to be compensated between the input signals. This phase shifted signal, translated into a high frequency after being filtered by the filter 3, is applied on an input of the mixer 13. It is mixed with the fixed frequency signal from the local oscillator 16 allowing a new frequency translation of this intermediate frequency phase-shifted signal into a second signal Vout1 in the initial frequency band.

In parallel, on the second channel the input signal Vant2, received by the antenna A2 and amplified by the amplifier 2, is applied to the wideband phase shift device 10 as claimed. This signal Vant2 applied to one of the inputs of the mixer 12 is multiplied with the fixed frequency local oscillation signal from the local oscillator 16 and phase shifted by the phase shifter 15 voltage controlled by the signal from the control block 8, thus translating to the intermediate frequency. The sum and the difference of the frequencies are thus generated. By means of the filtering realised by the filter 4, the low band 940-1330 MHz for example is selected thus allowing an infradyne mode translation. The translated signal IF2 is phase shifted by −φ with respect to the input signal. This phase shift −φ introduced by the phase shifter onto the translated signal enables half of the phase shift 2 φ to be compensated between the input signals. This phase shifted signal, translated into a low frequency after being filtered by the filter 4, is applied on an input of the mixer 14. It is mixed with the fixed frequency signal from the local oscillator 16 allowing a new frequency translation of this intermediate frequency phase-shifted signal into a second signal in the initial frequency band.

This device re-phases the input signals on the 2 channels of this device.

The phase shift of these input signals being 2 φ, the control circuit will introduce on the first channel by means of the phase shifter 15 a phase shift of +φ and on the second channel a phase shift of −φ.

The phase shift of 2φ between the input signals will therefore be compensated and the output signals of the 2 channels of the phase shift device will therefore be in phase. The phase shift introduced on each channel is controlled well over a very wide frequency band as it is from a phase shift introduced on the fixed frequency local oscillator.

The two output signals Vout1 and Vout2 will then be added by the summator 6 so as to provide a signal IF3 at the output which is the sum of the signals Vout1 and Vout2, in phase, thus maximising the amplitude of the restored signal IF3.

The control means of the phase shifter 8 delivering a control signal of the phase shifter. This signal is from, for example, a measurement of signal power in the channel at the exit of tuner 6. The control signal can also be, in another embodiment, reception quality information from the demodulator 7 to optimise reception quality. Consequently, the phase shift will be gradual as it always depends on the reception signal.

To clarify the understanding of this device, we can consider the extreme case for which the signals at the output of the two antennas are in phase opposition. The phase difference 2 φ between the input signals therefore equals π. The phase shift device allows the signal on one of the channels to be phase shifted by +φ=+π/2 and on the other channel by −φ=−π/2, phase shift introduced by the phase shifter 15. The 2 signals Vout1 and Vout2 will therefore be in phase. The signal from the summator 6 will therefore be maximised.

The variable phase device as proposed introduces a controlled phase shift at the level of the first and second mixers so as to maximise the amplitude of the signal recovered at the output of the summator. It thus enables the reception quality to be improved noticeably.

The concept can be fully integrated into a component (excluding filtering) on the basis for example of an implementation of the phase shifter described above.

Figure 3:
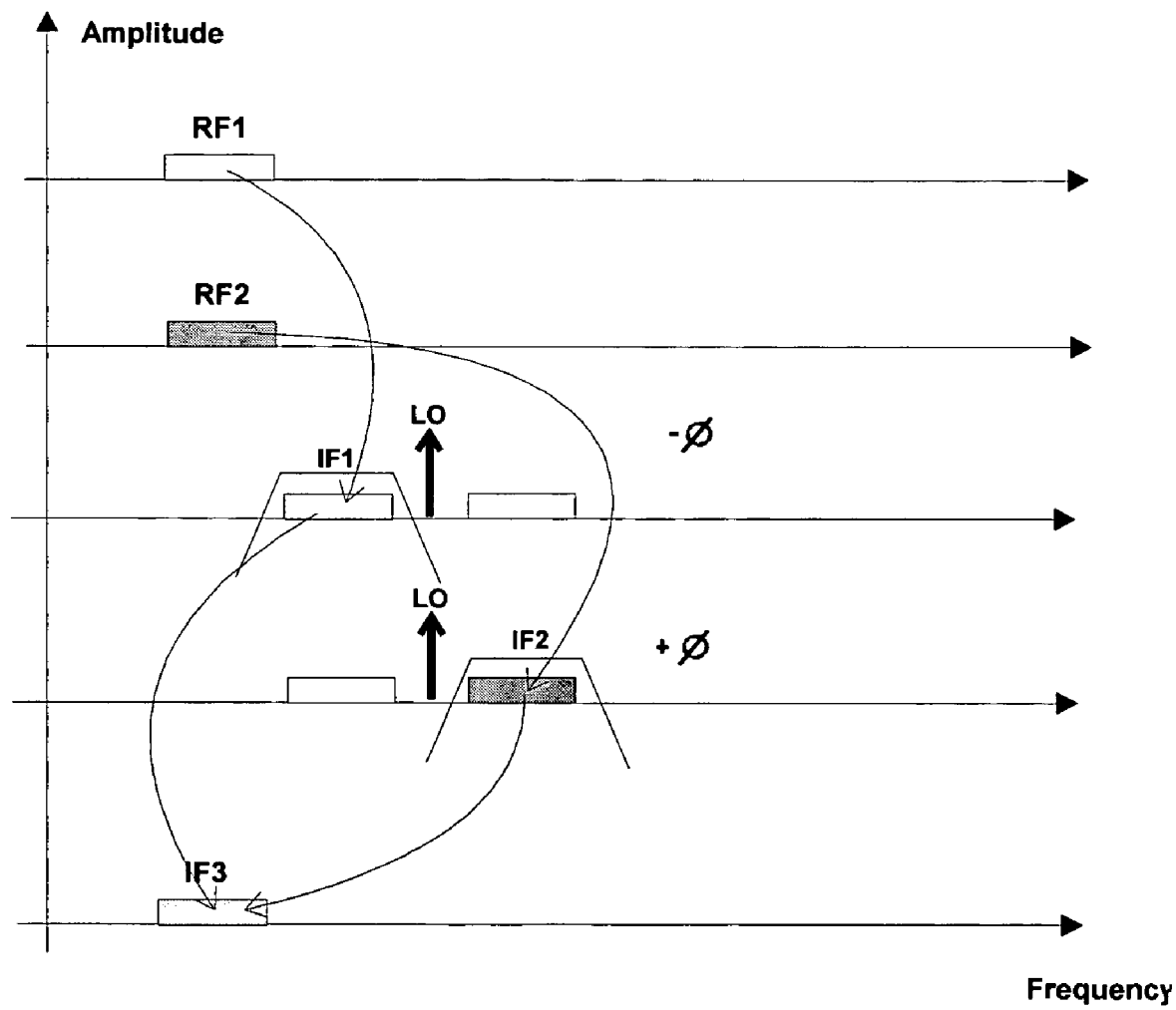
FIG. 3 illustrates the different frequency and filtering translation operations implemented.

FIG. 3 illustrates the different frequency and filtering translation operations to be implemented.

The RF1 band of the input signal of the first antenna A1 is translated into high band by the signal from the local oscillator 16 and phase shifted (+φ) to obtain the intermediate frequency band IF1 with a phase shift +φ.

The RF2 band of the input signal of the second antenna A1 is translated into low band by the signal from the local oscillator 16 and phase shifted (−φ) to obtain the intermediate frequency band IF2 with a phase shift −φ.

The intermediate frequency bands IF1 and IF2 are again translated by the signal from the local oscillator 16 then added to obtain the resulting frequency IF3.

The resulting phase shift 2 φ between the two channels is thus doubled with respect to the phase shift (φ introduced either positively or negatively by the phase shifter.

If the mixers are subharmonic, the phase shift between the two channels is quadrupled. Indeed, the harmonics at the frequency 2$f$ will have a phase shift of 2 φ and will be applied to the mixers 11 and 12 positively on one channel and negatively on the other, thus allowing a phase shift of 4 φ between the translated signals IF1 and IF2.

The invention claimed is:

1. Wideband phase shift device comprising
    translation means formed by a first series of mixers to transpose the first input signals received by the two antennas into transposed signals and by a second series of mixers to transpose the transposed signals after being filtered by eternal filters into two second output signals at an initial frequency;
    oscillation means to send a local oscillation signal on each of the first series of mixers and second series of mixers;

wherein
the oscillation means comprise a single local fixed frequency oscillator connected by means of a phase shifter to the first series of mixers and connected directly to the second series of mixers so as to compensate for the phase shift between the different incoming signals during a double frequency translation.

2. Wideband phase shift device according to claim 1, wherein the phase shifter is voltage controlled by a signal from a control means enabling the fixed frequency signal from the local oscillator to be gradually phase shifted and applied to the first series of mixers.

3. Wideband phase shift device according to claim 2, wherein the phase shifter introduces a positive phase shift on one of the signals and a negative phase shift on the other input signal so as to double the phase shift introduced by the phase shifter between the intermediate frequency signals.

4. Wideband phase shift device according to claim 1, wherein the mixers are subharmonic mixers quadrupling the phase shift introduced by the phase shifter between the intermediate frequency signals.

5. Wideband phase shift device according to claim 1, wherein the wideband phase shift device is integrable.

* * * * *